United States Patent [19]

Kadomura

[11] Patent Number: 5,401,359
[45] Date of Patent: Mar. 28, 1995

[54] DRY ETCHING METHOD

[75] Inventor: Shingo Kadomura, Kanagawa, Japan

[73] Assignee: Sony Corporation, Tokyo, Japan

[21] Appl. No.: 998,769

[22] Filed: Dec. 29, 1992

Related U.S. Application Data

[63] Continuation of Ser. No. 735,639, Jul. 25, 1991, abandoned.

[30] Foreign Application Priority Data

Jul. 27, 1990 [JP] Japan ............... 2-198045

[51] Int. Cl.6 .................................... H01L 21/00
[52] U.S. Cl. .................................... 156/662; 156/643; 156/646; 156/659.1
[58] Field of Search ............ 156/662, 643, 646, 656, 156/657, 659.1

[56] References Cited

U.S. PATENT DOCUMENTS

| | | | |
|---|---|---|---|
| 4,368,099 | 1/1983 | Huggett et al. | 156/628 |
| 4,431,477 | 2/1984 | Zajac | 156/646 X |
| 4,473,939 | 10/1984 | Feng et al. | 437/18 |
| 4,729,967 | 3/1988 | Armiento | 156/656 X |
| 4,992,136 | 2/1991 | Tachi et al. | 156/643 |
| 4,999,320 | 3/1991 | Douglas | 156/646 X |
| 5,030,319 | 7/1991 | Nishino et al. | 156/646 X |
| 5,266,157 | 11/1993 | Kalomura | 156/643 |

FOREIGN PATENT DOCUMENTS

| | | |
|---|---|---|
| 62-250643 | 10/1987 | Japan . |
| 63-174322 | 7/1988 | Japan . |
| 3-60032 | 3/1991 | Japan . |
| 03177020 | 8/1991 | Japan . |
| 04127528 | 4/1992 | Japan . |

*Primary Examiner*—R. Bruce Breneman
*Assistant Examiner*—George Goudreau
*Attorney, Agent, or Firm*—Hill, Steadman & Simpson

[57] ABSTRACT

A method for anisotropic dry etching of a layer of a silicon oxide-based material with high etching base selectivity and low contamination without employing fluorocarbonaceous gases, is proposed. Sulfur fluorides with a low F/S ratio, such as $S_2F_2$, are employed as an etching gas, and etching is performed by a mechanism in which ions such as $SF_x^+$ assist a radial reaction by $F^*$. High selectivity with respect to silicon-based material is assured by S deposits thereon when silicon oxide-based material is etched off. Since S may be easily removed by sublimation by wafer heating after etching, contamination by particles is not produced. By previously implanting ions into an area to be etched, or by providing a sulfur-based material in the vicinity of the wafer, sulfur may be sputtered out into an etching system as etching proceeds to improve selectivity with respect to the base silicon. The end point of etching of the layer of the silicon oxide-based material may be acutely determined by detecting a time point at which the intensities of sulfur oxide peaks are decreased abruptly during monitoring an emission or a mass spectrum.

15 Claims, 2 Drawing Sheets

DRY ETCHING METHOD

CROSS REFERENCE TO RELATED APPLICATIONS

The present application is a continuation of application Ser. No. 735,639, filed Jul. 25, 1991, and now abandoned.

BACKGROUND OF THE INVENTION

1. Field of the Invention

This invention relates to a dry etching method and, more particularly, to a method for carrying out low-temperature anisotropic etching of a layer of a silicon oxide material at higher accuracy without employing a fluorocarbonaceous gas.

2. Description of Related Art

The technology of dry etching of a layer of a silicon oxide material with a high selectivity with respect to the layer of the silicon-based material is one of the etching processes extensively applied to manufacture of LSIs since the time when a 64K DRAM was developed. Typical of such dry etching is an etching of a silicon oxide interlayer insulating film, which is performed, with the use of a silicon substrate or a polycrystalline silicon layer as an etching base, for forming a contact on an impurity diffusion region formed in a semiconductor substrate or on a source/drain region of a pMOS transistor employed as a resistance load device of an SRAM.

Conventionally, for dry etching a layer of a silicon compound, such as silicon oxide, at a high selectivity with respect to the layer of a silicon-based material, $CHF_3$, a $CF_4/H_2$ mixed system, a $CF_4/O_2$ mixed system or a $C_2F_6/CHF_3$ mixed system, has been used as an etching gas. These etching gases are mainly composed of a fluorocarbonaceous gas having the ratio of the number of carbon atoms to that of fluorine atoms in a molecule (C/F ratio) of not less than 0.25. These gas systems are employed because (a) C contained in the fluorocarbonaceous gas forms a C—O bond on the surface of a silicon oxide layer to disrupt or weaken the Si—O bond, (b) an $CF_x^+$ ion above all a $CF_3^+$ ion, which is a main etchant for the layer of the silicon oxide layer, may thereby be yielded and (c) a state relatively rich in carbon may thereby be produced in a plasma, so that the oxygen in a silicon oxide is removed in the form of CO or $CO_2$; on the other hand, a carbonaceous polymer is deposited on the surface of the layer of the silicon-based material, on account of the contribution of C, H and F contained in the gas system, thereby lowering the etching rate so as to give a high selectivity with respect to the layer of the silicon-based material.

It is noted that $H_2$ and $O_2$ as addition gases are used for controlling the selectivity, and are able to lower or raise the amount of yield of $F^*$, respectively. In short, these gases have the effects of controlling the apparent C/F ratio of the etching reaction system.

In such an etching reaction system, attempts have been made to improve the selectivity with respect to the layer of the silicon-based material by increasing the supply of carbon. For example, the present inventor has proposed in Japanese Patent KOKAI Publication Hei-3-60032 (1991) a technology in which carbon is introduced by an ion implantation in the vicinity of a boundary surface between a silicon oxide layer and a silicon layer, and a technology in which a material composed of carbon is placed as a peripheral component of a sample wafer. With the former method by the ion implantation, carbon starts to be yielded when the etching reaches the vicinity of the boundary surface. However, as long as silicon oxide exists in the etched region, this carbon is removed out of the system as CO or $CO_2$ without interfering with the etching of the layer of the silicon oxide-based material. However, if the silicon layer is exposed, carbon is deposited thereon in the form of a polymer to obstruct the etching of the silicon layer to improve the selectivity with respect to the silicon layer.

With the latter method of placing carbon-containing pieces of material as a peripheral component of the sample wafer, carbon is supplied to the system from time to time during etching by a sputtering effect to improve the selectivity by a mechanism similar to that described above. For example, such components as a cathode cover, wafer clamp or a susceptor may be constituted of such materials as silicon carbide, polycarbonate, Teflon or polyallylate.

With the above described conventional etching in which carbon is involved, an etching end point is usually determined on the basis of an abrupt decrease in intensity of a CO peak at 519 nm in the emission spectrum.

The above is an approach to establish a compatibility between anisotropy and selectivity through selection of an etching gas and selection of the material of peripheral components. In addition, in the field of dry etching of recent origin, a low temperature etching, that is an etching in which a sample wafer is maintained at a lower temperature of 0° C. or lower during etching, as reported in Proceedings of Dry Process Symposium, 1988, pages 42 to 49, is re-attracting attention. Such low temperature etching has been proposed with a view to preventing shape defects, such as side etching, by inhibiting a radical reaction at the sidewall section, with an etching rate along the depth being maintained by ion-assist effects.

Meanwhile, flon compounds (chlorofluorocarbon gases) have been pointed out as leading to the destruction of an ozone layer surrounding the earth, and the prospect is high that manufacture and use thereof may be prohibited in the near future. Although the fluorocarbon gases are not encompassed within the category of specified flon compounds on which regulations have become more severe in recent years, the prospect is high that a ban may be placed on such fluorocarbon gas in the future. Under these circumstances, development of an etching gas as a substitute for the fluorocarbon gas and a technique of using such a substitute gas has become incumbent in the field of dry etching.

On the other hand, with further refinement of a design rule for a semiconductor device in the future, it may be feared that contamination by carbonaceous polymer particles derived from the fluorocarbon gases may bring out more grave consequences. Elimination of the fluorocarbon gases is also desirable in this consideration. Even if the fluorocarbonaceous gases can be eliminated, it is further feared that the above mentioned carbon-containing peripheral components may threaten to be a source of contamination, As a solution to this problem, it has been envisaged to constitute the wafer clamp or the cathode cover of quartz. However, this is tantamount to increasing the area to be etched at the time of etching of the layer of the silicon oxide-based material. The process may not be said to be practically useful in that the etching rate is significantly lowered under the loading effect.

OBJECTS AND SUMMARY OF THE INVENTION

It is an object of the present invention to provide a method for dry etching according to which low contamination and high anisotropy etching may be achieved at a high selectivity with respect to the layer of the silicon-based material without employing fluorocarbonaceous gases.

As a result of our eager searches towards accomplishing the above object, the present invention has found that the above mentioned various problems may be overcome by transferring the role of carbon in the conventional etching of the layer of the silicon oxide-based material to sulfur and by carrying out etching at a lower temperature. The finding has led to the proposal of the present invention.

Thus the dry etching method of the present invention is characterized in that etching of a layer of a silicon oxide-based material is carried out using an etching gas containing at least one of $S_2F_2$, $SF_2$, $SF_4$ and $S_2F_{10}$, while a substrate for etching is cooled to room temperature or lower.

The above mentioned compounds $S_2F_2$, $SF_2$, $SF_4$ and $S_2F_{10}$ are generally termed sulfur fluorides. Among the sulfur fluorides, $SF_6$ is also known as being the most stable and has been put to practical use as a dry etching gas. However, if $SF_6$ is used to etch the layer of the silicon oxide-based material which has a layer of a silicon-based material as the etching base, a large quantity of fluorine radicals are yielded because the gas has the ratio of the number of fluorine atoms to the number of sulfur atoms in each molecule (F/S ratio) as high as 6, and these fluorine radicals, while etching the layer of the silicon-based material, will lower the selectivity. However, the F/S ratios of the above mentioned sulfur fluorides employed in accordance with the present invention are 1, 2, 4 or 5, which is lesser than the ratio of $SF_6$ and suffers from the risk of lowering of the selectivity to a correspondingly lesser extent.

If the layer of the silicon oxide-based material is etched using sulfur fluoride of the present invention, silicon in the silicon oxide yields volatile silicon fluorides mainly under the operation of $SF_x^+$, $S^+$ or $F^+$ or the like ions derived from the sulfur fluorides, while oxygen in silicon oxide is combined with sulfur to yield volatile sulfur oxides, such as SO or $SO_2$. These volatile compounds are removed out of the etching system. It is noted that, according to the present invention, the temperature of the sample wafer is control led to be lower than room temperature, so that the reaction by $F^*$ is inhibited or limited and hence side etching may be suppressed effectively. On the other hand, when etching of the layer of the silicon oxide-based material is substantially terminated and the layer of the silicon-based material starts to be exposed, the supply of oxygen to be bonded with sulfur becomes depleted, and when the temperature of the sample wafer is controlled as described above, sulfur is deposited on the surface of the layer of the silicon-based material. Such deposition impedes etching of the layer of the silicon-based material to assure a high selectivity with respect to the layer of the silicon-based material to evade a damage otherwise caused to the etching base when overetching the silicon oxide-based material layer. Moreover, since the deposited sulfur may be easily removed by sublimation on heating the sample wafer, the risk of contamination by particles may be reduced to a larger extent than with the conventional etching method which achieves high anisotropy by deposition of a carbonaceous polymer.

With the above described basic mechanism of the etching reaction which takes place in accordance with the present invention, there is a possibility that if the area to be etched is extremely small, an amount of sulfur enough to assure high selectivity cannot be deposited. Thus the present invention also provides two methods for replenishing sulfur. One of the methods is to perform etching after sulfur is previously introduced by ion implantation into an area to be etched. In this manner, sulfur is yielded from the etching area as etching proceeds, so that, in conjunction with sulfur released from the etching gas, the amount of sulfur in the system may be increased. The other method is to arrange an internal component of an etching apparatus in the vicinity of the periphery of the sample wafer, wherein at least the surface of the internal component is formed of a sulfur-containing material. Sulfur released from these components by sputtering replenishes sulfur in the etching system.

The present invention also provides, in conjunction with the novel etching gas, a method for determining an end point of the etching. This is rendered possible by monitoring an emission spectrum or a mass spectrum of sulfur oxide. With the dry etching method of the present invention, sulfur oxides, such as SO or $SO_2$, are yielded only during progress of the etching of the silicon oxide-based material layer, and are decreased abruptly at a time point when the silicon-based material layer is exposed. Therefore, the etching end point can be determined acutely by monitoring the emission spectrum or the mass spectrum and deeming the time point of a rapidly decreased peak intensity of sulfur oxide to be the end point.

In this manner, in accordance with the present invention, low temperature etching of the silicon oxide material layer is carried out using sulfur fluoride gases exhibiting lower F/S ratios, sulfur is occasionally replenished into the etching system, and the etching end point is determined acutely. Therefore, in accordance with the present invention, high anisotropy and high selectivity may be achieved simultaneously by a dexterous mechanism to render it possible to produce semiconductor devices of high integration, high reliability and high performance with good reproducibility and economic profitability. The present invention also provides extremely effective measures for dispensing with the use of the flon compounds.

BRIEF DESCRIPTION OF THE DRAWINGS

FIGS. 1A to 1C are schematic cross-sectional views for illustrating an embodiment of the present invention as applied to the etching of an interlayer insulating film, step by step, wherein FIG. 1A shows the state before start of the etching, FIG. 1B shows the state during the etching and FIG. 1C shows the state after the end of the etching.

FIGS. 2A to 2C are schematic cross-sectional views for illustrating another embodiment of the present invention as applied to the etching of an interlayer insulating film, step by step, wherein FIG. 2A shows the step of ion implantation, FIG. 2B shows the state during the etching and FIG. 2C shows the state after the end of the etching.

DETAILED DESCRIPTION OF THE INVENTION

Figure 1A:
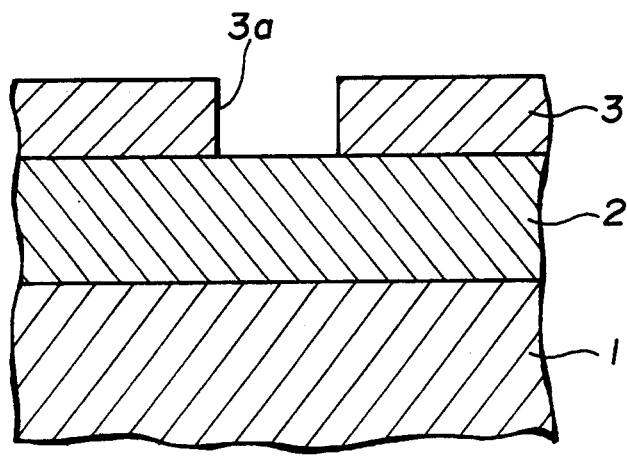

By referring to the drawings, the present invention will be explained in detail by taking several examples.

EXAMPLE 1

In the present example, an interlayer insulating film, formed of silicon oxide, is etched by using an $S_2F_2$ gas. The present example is explained by referring to FIGS. 1A to 1C.

Figure 1B:
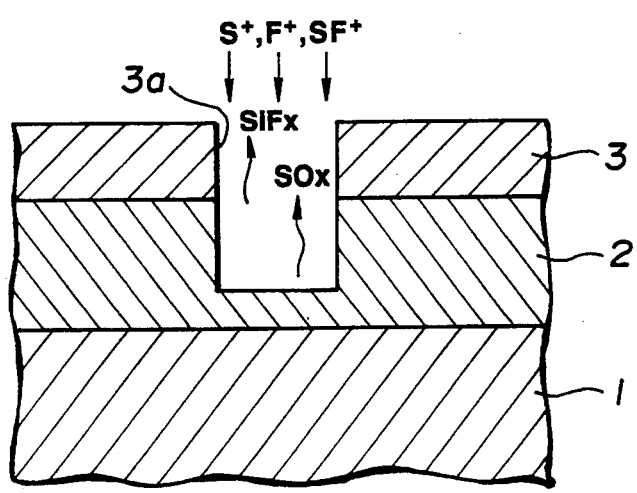

In the first place, as shown in FIG. 1A, an interlayer insulating film 2 is formed on a silicon substrate 1, and a photoresist layer 3 having an aperture 3a is formed, by a predetermined patterning, as a mask for etching the interlayer insulating film 2.

A sample wafer thus produced was set on a magnetron RIE apparatus, provided with a cooling system for controlling the temperature of the sample wafer to not higher than room temperature, and was cooled to a temperature of approximately $-100°$ C. with the aid of liquid nitrogen. As the cooling system, cooling system of any desired configuration, such as a system comprised of a wafer-setting electrode with a piping system for circulation of a coolant, a Peltier device or the like enclosed therein, or a system comprised of a wafer-setting electrode partially immersed in a coolant contained in a vessel, may be employed.

In this state, etching was carried out under the conditions of an $S_2F_2$ gas flow rate of 100 SCCM, a gas pressure of 10 mTorr and an RF power of 1.0 kW (2 MHz). Progress of the etching was monitored by emission spectrum. As a result, the etching of the interlayer insulating film 2 proceeded within the aperture 3a, and a pattern having a vertical wall was obtained. During this process, the etching proceeded while ions such as $SF_x^+$, $S^+$ or $F^+$, yielded from the $S_2F_2$ gas, impinged on the bottom of the aperture 3a to activate the surface of the layer 2 to assist the reaction between Si and F atoms previously adsorbed thereon. At this time, sulfur is combined with oxygen in the interlayer insulating film 2 and removed from the system in the form of SO or $SO_2$ without impeding the etching reaction. Meanwhile, SO generation could be monitored from peaks in the vicinity of 316 nm and 327 nm in the emission spectrum, whereas $SO_2$ generation could be monitored from peaks in the vicinity of 300 nm in the spectrum.

Figure 1C:
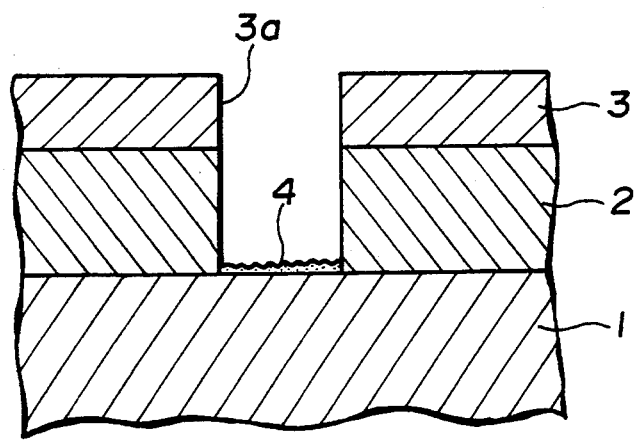

As the etching proceeded further, and the silicon substrate 1 is exposed, sulfur which are unable to be bonded with oxygen which is depleted starts to be deposited on the bottom in conjunction with the cooling effect, so that a deposited sulfur layer 4 was formed, as shown in FIG. 1C. As a result of the deposited sulfur layer 4 interfering with the etching of the silicon substrate 1, an extremely high etching base selectivity could be achieved with the present example. Meanwhile, the etching end point could be determined acutely because the above-mentioned emission spectrum peak intensities botch decreased abruptly.

When the temperature of the sample wafer was returned room temperature after the end of the etching, the layer of deposited sulfur 4 sublimated and disappeared promptly. Hence, no contamination by particles occurred in an etching chamber of the RIE apparatus.

The present invention is not limited to the above described embodiment, and encompasses various modifications within the scope of the invention.

For example, the etching gas may be any other gas or a gas mixture of two or more gases, as specified by the invention, in addition to $S_2F_2$. $H_2$ may be added to the gas or gas mixture for capturing F* ions for thereby improving the selectivity with respect to silicon further and for lowering the apparent F/S ratio. Rare gases may also be added for dilution, if so desired.

Although the magnetron RTE apparatus was employed in the above embodiment as an etching apparatus, an RF biasing magnetic microwave plasma etching apparatus may also be employed. The etching conditions may be modified if so desired.

A number of emission spectrum peaks of the sulfur oxides exist besides those art the above mentioned three wavelengths, and may be employed for determining the etching end point. It is however preferred to employ such peaks having sufficient intensities and existing in wavelength bands which can be monitored through a quartz window. The above mentioned three peaks have been selected in this consideration. The etching end point may also be determined by monitoring the peaks proper to various sulfur oxides appearing in the mass spectrum.

EXAMPLE 2

In the present example 2, an interlayer insulating film was etched by an $S_2F_2$ gas after introducing ions into an etched area by ion implantation. The present example is explained by referring to FIGS. 2A to 2C.

Figure 2A:
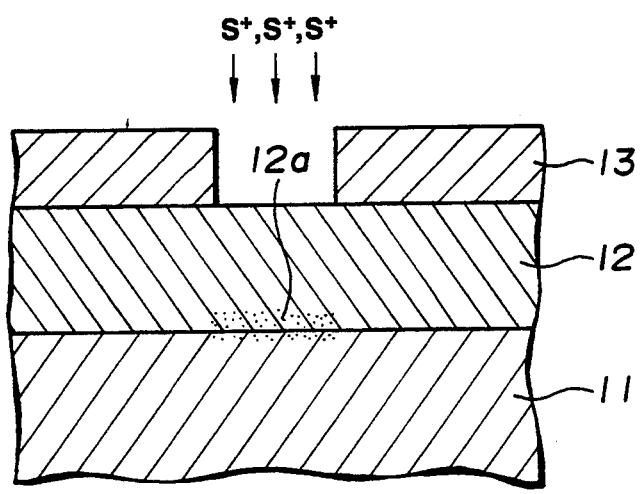

In the first place, as shown in FIG. 2A, an interlayer insulating film 12, formed of silicon oxide, was formed on a silicon substrate 11, and a photoresist layer 13, patterned to a predetermined shape, was formed on the layer 12, to complete a sample wafer. Sulfur ions were introduced by ion implantation with the photoresist layer 13 as a mask. It is preferred that, during the ion implantation, ion energy be suitably controlled so that the projection range will be approximately equal to the thickness of the interlayer insulating film 12. In this manner, a high sulfur concentration region 12a was formed in the vicinity of a boundary surface between the interlayer insulating film 12 and the silicon substrate 11.

Figure 2B:
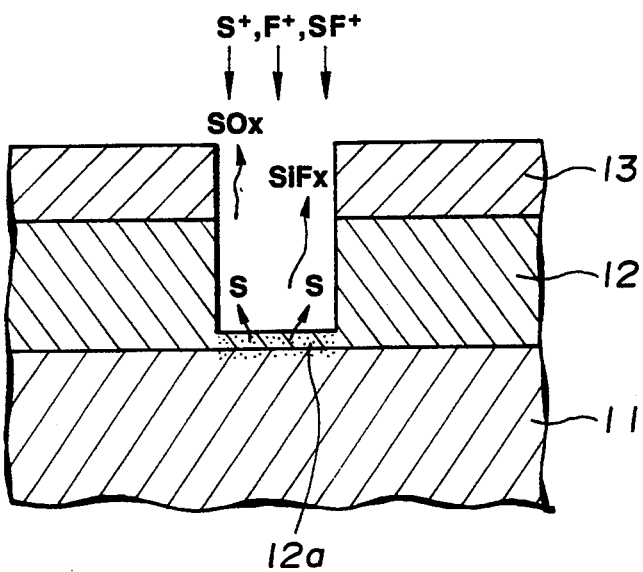

The interlayer insulating film 12 was then etched in the same way as in example 1. As the etching bottom surface approached the boundary surface between the interlayer insulating film 12 and the silicon substrate 11, sulfur was effectively sputtered out by the sputtering action, as shown in FIG. 2B.

Figure 2C:
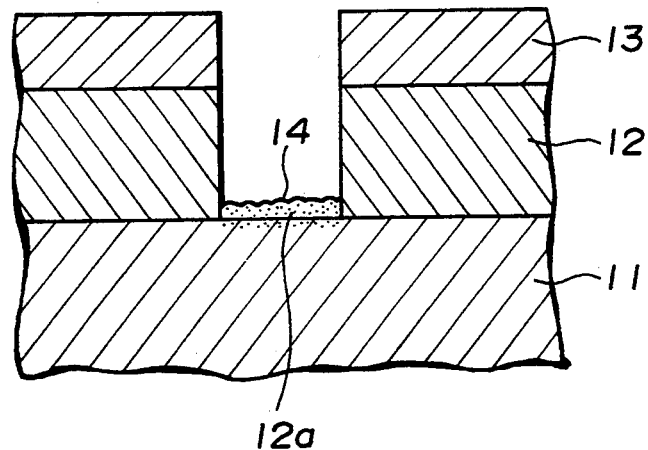

When the silicon substrate 11 was exposed, a layer of deposited sulfur 14 was similarly formed, as shown in FIG. 2C, to terminate the etching. The thickness of the layer of deposited sulfur 14 was thicker than that obtained in example 1, so that selectivity with respect to the etching was base improved further.

EXAMPLE 3

In the present example 3, a cathode cover of the magnetron RIE apparatus was constituted of silicon sulfide SiS and an interlayer insulating film was etched using an $S_2F_2$ gas.

The substrate as shown in FIG. 1A was etched under the conditions of, for example, an $S_2F_2$ gas flow rate of 50 SCCM, an $H_2$ gas flow rate of 10 SCCM, a gas pressure of 7.5 mTorr and an RF power of 1.2 kW (2 MHz) while a wafer setting electrode was cooled to approximately $-100°$ C. Since sulfur was also supplied by the sputtering action from the cathode cover under these conditions, the layer of deposited sulfur was effectively formed at the time point when the silicon substrate surface was exposed, so that high selectivity could be achieved easily.

EXAMPLE 4

In the present example 4, a coating of a sulfur nitride polymer $(SN)_x$ was applied to the surface of a wafer clamp of an RF-biasing magnetic microwave plasma etching apparatus, and a silicon oxide layer was etched by an $S_2F_2$ gas while the sample wafer was held by the wafer clamp.

The wafer clamp employed in the present example includes an alumina body member on the upper surface of which a layer of the sulfur nitride polymer was formed. Since the sulfur nitride polymer layer was consumed during the etching, the thickness of the polymer layer is to be suitably set as a function of the number of sample wafers included in an etching lot.

The substrate shown in FIG. 1A was etched, under the conditions for example of an $S_2F_2$ gas flow rate of 50 SCCM, an $H_2$ gas flow rate of 10 SCCM, a gas pressure of 10 mTorr, a microwave power of 850 W and an RF bias power of 100 W (2 MHz), while a wafer setting electrode of the etching apparatus was cooled to approximately $-100°$ C. As a result, sulfur was sputtered out from the sulfur nitride polymer layer by the sputtering action, so that high selectivity could be achieved easily.

Although the body member of the cathode cover and the surface of the wafer clamp were formed of a sulfur-containing material in the above examples 3 and 4, respectively, similar measures may be taken on an internal component of the etching apparatus, such as a wafer cover or a susceptor, provided that such internal component has a surface oriented so as to enable sputtering and is arranged in proximity to the sample wafer.

These internal components may be formed of a variety of inorganic materials. For example, these components may be formed of a ceramic material, such as alumina or silicon nitride, on the surface of which sulfur powders are affixed by sintering, powders of a ceramic material and sulfur powders molded together by powder sintering, or a piece of an inorganic material on the surface of which a sulfur plate is affixed by an adhesive. Some sulfur-containing organic polymer materials, such as polysulfone, polyphenylene sulfide, polyphenylene sulfone or polythiophene, are low in the relative content of sulfur and tend to give rise to contamination by carbon particles, so that the above mentioned inorganic materials are preferred.

It is to be noted that, if the above described internal components of the etching apparatus are used in combination with sulfur ion implantation, more sulfur may be supplied into the etching reaction system to improve selectivity more significantly.

What is claimed is:

1. A method for dry etching comprising the steps of providing a wafer of a silicon base material having a surface with a layer of silicon oxide, forming an etching mask on said layer of silicon oxide to expose selected portions thereof, providing an etching gas containing at least one kind of sulfur fluoride selected from a group consisting of $SF_2$, $S_2F_2$, $SF_4$ and $S_2F_{10}$, plasma etching the exposed selected portions of the silicon oxide with the etching gas until sulfur is deposited on exposed portions of the silicon base material when the silicon oxide layer has been removed therefrom.

2. A method according to claim 1, which includes, prior to the steps of providing an etching gas and reacting the gas with exposed portions of silicon oxide, a step of ion plantation of sulfur into a boundary area between the layer of silicon oxide and said silicon base material.

3. A method according to claim 1, which includes providing an internal component of an etching apparatus disposed in the vicinity of said wafer, said internal component having at least a surface being formed of a sulfur-containing material to add additional sulfur gases to the etching gas.

4. A method according to claim 3, wherein the internal component is formed of a material selected from a group consisting of materials having sulfur sintered on a surface thereof, materials having sulfur powder sintered therein, and materials having a sulfur-nitride polymer film applied on a surface thereof.

5. A method according to claim 3, wherein said internal component is at least one selected from a group consisting of cathode covers, wafer clamps and wafer covers and susceptors.

6. A method according to claim 1, which includes detecting an end point of the etching of the layer of silicon oxide from the base material by monitoring at least one of the emission spectrum and mass spectrum of a sulfur oxide.

7. A method according to claim 6, wherein said step of detecting the end point utilizes a decreased intensity of the emission spectrum peaks of the sulfur oxide appearing in the vicinity of at least one wavelength selected from a group consisting of 316 nm, 327 nm and 300 nm.

8. A method for dry etching comprising the steps of providing a wafer of a silicon base material having a surface with a layer of silicon oxide; forming an etching mask on said layer of silicon oxide to expose selected portions thereof; maintaining the wafer at a temperature lower than room temperature; providing an etching gas free of carbon and containing at least one kind of sulfur fluoride selected from a group consisting of $SF_2$, $S_2F_2$, $SF_4$ and $S_2F_{10}$; plasma etching the exposed selected portions of the silicon oxide with the etching gas to produce gaseous phases of volatile $SiF_4$, $SO$ and $SO_2$ gases, said etching continuing until sulfur is deposited on exposed portions of the silicon base material when the silicon oxide layer has been removed therefrom and no oxygen remains to react with the sulfur; and then, subsequent to completing the etching, heating the wafer to remove the pure sulfur from the silicon base material.

9. A method according to claim 8, which includes, prior to the steps of providing an etching gas and reacting the gas with exposed portions of silicon oxide, a step of ion implantation of sulfur into a boundary area between the layer of silicon oxide and said silicon base material.

10. A method according to claim 8, which includes providing an internal component of an etching apparatus disposed in the vicinity of said wafer, said internal component having at least a surface being formed of a sulfur-containing material to add additional sulfur gases to the etching gas.

11. A method according to claim 10, wherein the internal component is formed of a material selected from a group consisting of materials having sulfur sintered on a surface thereof, materials having sulfur powder sintered therein, and materials having a sulfur-nitride polymer film applied on a surface thereof.

12. A method according to claim 10, wherein said internal component is at least one selected from a group consisting of cathode covers, wafer clamps and wafer covers and susceptors.

13. A method according to claim 8, which includes detecting an end point of the etching of the layer of silicon oxide from the base material by monitoring at least one of the emission spectrum and mass spectrum of a sulfur oxide.

14. A method according to claim 13, wherein said step of detecting the end point utilizes a decreased intensity of the emission spectrum peaks of the sulfur oxide appearing in the vicinity of at least one wavelength selected from a group consisting of 316 nm, 327 nm and 300 nm.

15. A method for dry etching comprising plasma etching a layer of a silicon oxide from a sample wafer of a base material by utilizing an etching gas containing at least one of the compounds selected from a group consisting of $S_2F_2$, $SF_2$, $SF_4$ and $S_2F_{10}$, with the temperature of a sample wafer being controlled so as to be lower than room temperature, said etching being performed with an internal component of an etching apparatus disposed in the vicinity of said sample wafer and said internal component having at least the surface being formed of a sulfur-containing material selected from a group consisting of a material having a sulfur sintered on the surface thereof, material being a sulfur powder sintered therein, and material having a sulfur-nitride polymer film applied on the surface thereof.

* * * * *